United States Patent
Fisher et al.

(10) Patent No.: US 9,520,307 B2
(45) Date of Patent: Dec. 13, 2016

(54) METHOD AND NOZZLE FOR HERMETICALLY SEALED PACKAGED DEVICES

(71) Applicant: Texas Instruments Incorporated, Dallas, TX (US)

(72) Inventors: Edward Carl Fisher, Lucas, TX (US); Jane Qian Liu, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/609,015

(22) Filed: Jan. 29, 2015

(65) Prior Publication Data

US 2016/0225643 A1    Aug. 4, 2016

(51) Int. Cl.
*H01L 21/56* (2006.01)
*H01L 23/00* (2006.01)
*B05B 1/14* (2006.01)
*G02B 26/08* (2006.01)

(52) U.S. Cl.
CPC ........... *H01L 21/561* (2013.01); *B05B 1/14* (2013.01); *G02B 26/0833* (2013.01); *H01L 24/83* (2013.01); *H01L 24/85* (2013.01); *H01L 24/96* (2013.01); *H01L 2224/96* (2013.01)

(58) Field of Classification Search
CPC .............. H01L 2924/01079; H01L 2924/14; H01L 2924/01029; H01L 2924/01078; H01L 2924/01013
USPC ................... 438/107, 110, 112, 113
See application file for complete search history.

(56) References Cited

U.S. PATENT DOCUMENTS

| | | | |
|---|---|---|---|
| 7,407,892 B2* | 8/2008 | Weimer | C23C 16/45546 257/E21.16 |
| 7,595,540 B2* | 9/2009 | Fukuda | B81B 7/0077 257/431 |
| 2014/0217597 A1* | 8/2014 | Lin | H01L 24/19 257/773 |

* cited by examiner

*Primary Examiner* — Quoc Hoang
(74) *Attorney, Agent, or Firm* — Michael A. Davis, Jr.; Charles A. Brill; Frank D. Cimino

(57) ABSTRACT

Microelectromechanical systems (MEMS) such as digital micromirror devices (DMD) are manufactured in arrays. Covers, packages, and lids are placed around each device and a liquid such as epoxy resin is dispensed around the packaged device. The epoxy resin acts as a sealant to form a hermetic seal. A nozzle comprises multiple orifices along a sidewall of the nozzle to dispense the epoxy resin horizontally and parallel to the plane of the wafer substrate. The distal ends of the nozzle are enclosed.

17 Claims, 9 Drawing Sheets

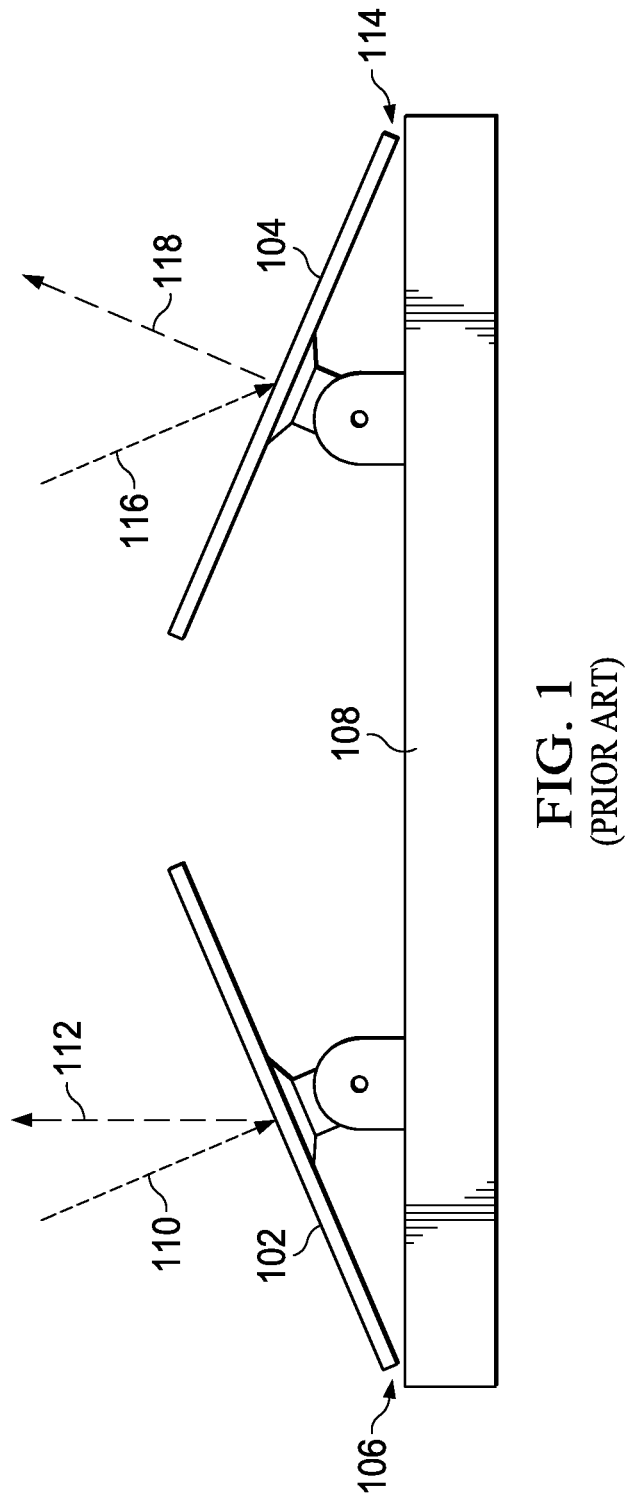

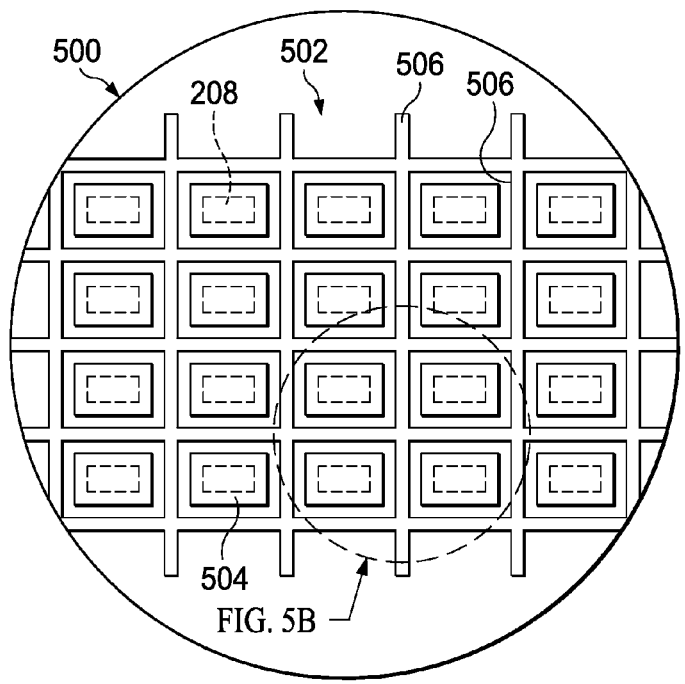
FIG. 5A
(PRIOR ART)
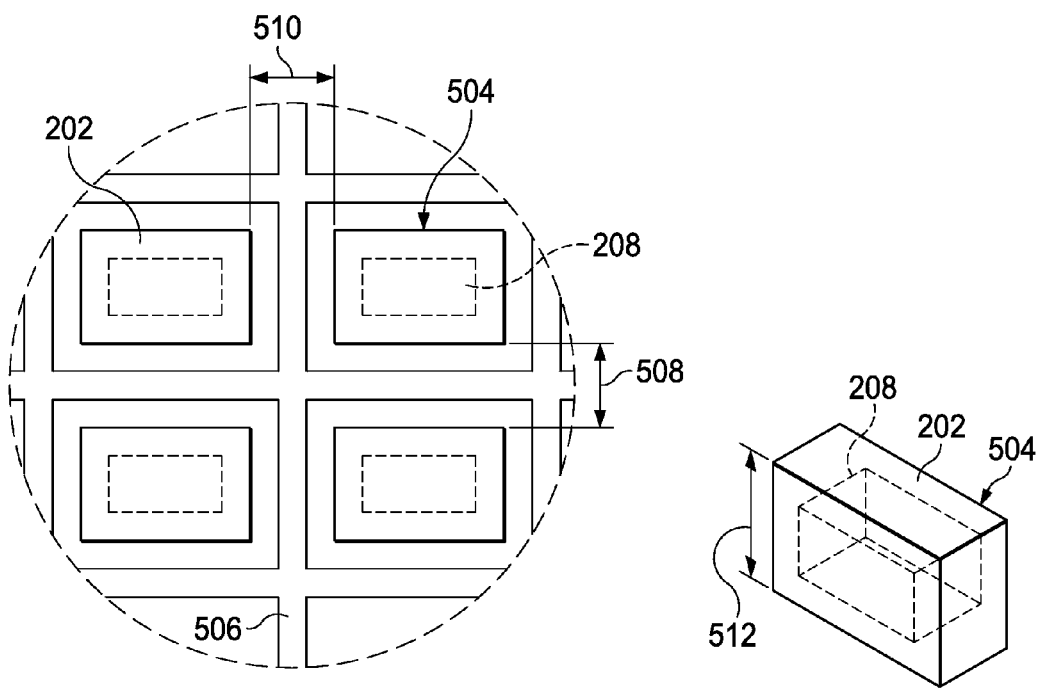
FIG. 5B
(PRIOR ART)
FIG. 5C
(PRIOR ART)

METHOD AND NOZZLE FOR HERMETICALLY SEALED PACKAGED DEVICES

This relates generally to semiconductor devices packaged at the wafer level such as microelectromechnical systems (MEMS) and digital micromirror devices (DMD).

BACKGROUND

MEMS devices integrate very small mechanical devices with semiconductors to form sensors (temperature, pressure, gas, moisture, and motion), accelerometers, valves, gears, actuators, and micromirror devices. MEMS are often sensitive to the environment and may require a hermetically sealed package to be isolated.

A package comprises a MEMS device mounted on a packaging substrate such as plastic or ceramic, wires attached to bond pads, and a cover to enclose the device. U.S. Pat. No. 7,491,567 B2 describes one method for enclosing the MEMS by inserting the supporting substrate with mounted device into a cavity formed by the packaging. Anther method of packaging places a cover over the supporting substrate and mounted device and attaches the cover to the substrate.

A digital micromirror device (DMD), such as a Texas Instruments DLP® micromirror device, is a type of MEMS device which uses an array of individually positionable mirrors to project an image onto a display panel. The array of mirrors is fabricated above CMOS substrate wafers using a material such as silicon. Each device typically comprises multiple mirrors and multiple devices are formed on the wafer substrate in a grid array pattern. Scribe lines are etched onto the wafer substrate and form clearly defined lines which can be used to more easily singulate each packaged device. The bottom surface of the CMOS supporting substrate is bonded to another substrate, typically silicon, for additional mechanical strength. Upon completion of the MEMS fabrication process, wires are attached from the device to the bond pads and transmit signals. The bonding wires are easily damaged or dislodged. Various methods can be used to contain semiconductor and micromirror devices and bonding wires, which are also attached to substrates. One method is to deposit encapsulation material above the device and wires to enclose and cover the assembly. Various types of covers can be placed around the device and wires. The substrate is singulated once the devices are packaged.

In the case of a DMD, the package protects the micromirror device while also forming an optically transparent window above the device. The device is able to receive an incoming signal and project an image through the optically transparent window and onto a display panel. The cover surrounding the micromirror device protects the bonding wires and the DMD but also prevents extraneous illumination from being incident onto the mirrors arrayed on the device.

FIG. 1 (Prior Art) is an illustration of an "ON" mirror 102 and an "OFF" mirror 104.

The mirror 102 is in an "ON" state. It is tilted towards a pad 106 on the silicon substrate 108. Light 110 is incident onto the mirror 102 and reflected light 112 is projected onto a display system to form an image. The "ON" state is equivalent to a digital "1".

The mirror 104 is in an "OFF" state. The mirror 104 is tilted toward a pad 114 on the substrate 108. Light 116 is incident upon the mirror 104 and reflected light 118 is projected away from the display system. The "OFF" state is equivalent to a digital "0" because no image is sent for display.

FIGS. 2A-B are drawings of a packaged micromirror device 200.

FIG. 2A (Prior Art) shows a top cover 202 attached to a package 204 comprised of a material such as plastic, metallic, or ceramic. The cover 202 is typically rectangular. The package 204 supports the cover 202 above the micromirror device 208. The cover 202 may be comprised of a material such as plastic, metallic, or ceramic and is attached to the supporting package 204 prior to singulation. An optically transparent window 206 is embedded within an opening in the top surface of the top cover 202 above a mirror array of the micromirror device 208.

FIG. 2B (Prior Art) is an expanded cross-sectional view of a corner portion of the top cover 202, the micromirror device 208, the transparent window 206, and the package 204. Wires 210 connect the micromirror device 208 to bond pads. The micromirror device 208 is placed within a cavity formed by the package 204 and the cover 202. The window 206 is placed within the cover 202 and above the micromirror device 208. A corner portion of the packaged device 200 is shown with a small gap or kerf 212.

Over time, as DMD devices become smaller, the dimensions of the area surrounding the packaged devices are reduced. Spacing between adjacent packaged device is smaller and more difficult for nozzles to access. The lumens used to project the optical image is increased to improve the visibility of the image but higher lumens also increases the visibility of any optical artifacts.

Light leaks into the packaged micromirror device 200 through the gap 212. The leaked light may be projected onto a display depending on the angle of incident light and the size of the gap 212 and the quality of the image reduced by the presence of leaked light.

FIG. 3 (Prior Art) shows an image 300 projected from the packaged micromirror device 200. A rectangle 304 is formed by the image 300 of white light emitted from the packaged micromirror device 200. Below the white rectangle 304, a horizontal line 306 is visible. The line 306 is the result of light leaking from the packaged micromirror device 200 through the gap 212.

FIG. 4 (Prior Art) is a cross-sectional drawing of a portion of the packaged micromirror device 200. The height 402 of the cover 202 is approximately 0.65 microns. The height 404 of the package 204 is approximately 0.75 microns. The height 406 of the packaged micromirror device 200 is approximately 1.703 microns. The height 408 of the kerf 212 is approximately 0.303 microns.

It is desired to dispense an epoxy based liquid or similar material in proximity to the cover 202 and as a sealant between the cover 202 and the package 204. Dimensions 402, 404, 406 and 408 are small and dispensing of materials can be difficult.

FIGS. 5A-C (Prior Art) describe an unsingulated wafer 500 with packaged micromirror devices 200.

FIG. 5A is a drawing of a wafer substrate 502 comprising an array of micromirror devices 208. Covers 202 are placed and sealed around each micromirror device 208 to form packaged devices 504. After packaging, scribe lines 506 are completely or partially sawn through the substrate 502. The scribe lines 506 form a boundary for each packaged device 504. If partially sawn, controlled mechanical pressure is applied along the scribe lines 506 to fracture the substrate 502.

FIG. 5B is an expanded top view of a portion of the unsingulated wafer 500. Micromirror devices 208 are enclosed within covers 202. Packaged devices 504 are separated from each other by a width 508 on the horizontal axis and a width 510 on the vertical axis.

FIG. 5C is a three dimensional drawing of a micromirror device 208 which is enclosed within a cover 202. The packaged device 504 with cover 202 has a height 512.

As devices shrink, dimensions 508, 510, and 512 are also reduced. The reduction in space between adjacent packaged devices 504 increases the probability of a notch or gap because typical nozzles are unable to fully access the required locations for fluid coverage. More importantly, a hermetic seal is not formed when the fluid cannot be dispensed correctly.

Encapsulation liquids are viscous and self-leveling. They are typically dispensed using a nozzle placed directly above the part being sealed. The nozzle is attached to an automated system which is programmed to follow a defined path above the substrate. At predefined intervals along the path, material is dispensed through the nozzle. The height of the package and spacing between adjacent packages can cause difficulty in dispensing. Both narrow spacing between adjacent packaged device 504 and the height of the packaged device 504 may prevent a typical nozzle from dispensing material at the required location to form a hermetic seal.

FIGS. 6A-D (Prior Art) show a variety of nozzles used for dispensing material in semiconductor packaging. These nozzles use positive displacement and standard Leur-Lock designs. These nozzles access the plane of the substrate 502 from a vertical direction above the substrate 502 and spray liquid perpendicularly to the plane of the substrate 502.

FIG. 6A is a drawing of a typical nozzle 600 used in semiconductor packaging. The nozzle 600 has a length 602 with an orifice 604 placed where material is dispensed. The nozzle 600 is generally with a width 606. The dispensing orifice has a width 608.

The nozzle 600 is limited by its length 602 which is smaller the than height 512 and unable to access the plane of the substrate 502. The nozzle 600 is also limited by the width of its diameter 606 at the dispensing orifice 604 which is larger than widths 508 and 510.

FIG. 6B illustrates a nozzle 610. Nozzle 610 has a length 612 which is longer than length 602. Nozzle 610 is generally cone-shaped. Nozzle 610 has a larger diameter 614 at the inlet where material is supplied and a smaller diameter 616 at the dispensing end with an orifice 618.

FIG. 6C is a drawing of a nozzle 620. Nozzle 620 has a length 622, which is typically longer than the length 602 of nozzle 600 and may have a length longer than the height 512 of a packaged device 504. Nozzle 620 is generally cylindrical with a diameter 624. The dispensing end comprises an orifice 626 of diameter 628. A longer length 622 and a smaller diameter 624 allow nozzle 620 to more easily access within dimensions 508, 510, and 512.

FIG. 6D illustrates a nozzle 630. Nozzle 630 comprises two cylindrical shapes of diameter 632 attached at a 90 degree angle between the supply inlet 634 and the dispensing end 646. The portion 638 between the supply inlet 634 and the 90 degree bend in the vertical direction has a length 640. The portion 644 between the 90 degree bend and the dispensing end 646 in the horizontal direction has a length 648. The dispensing end 646 comprises an orifice 648.

In nozzle 630, the liquid is dispensed horizontally and parallel to the plane of the wafer substrate. Horizontal dispensing is an advantage in directing the fluid to the cover edge. However, the length 648 is longer than dimensions 508 and 510, and nozzle 630 is unable to reach within the spacing between adjacent packaged devices 504.

SUMMARY

This method supports packaging of semiconductor substrate devices placed in close proximity.

A nozzle and method for hermetically sealing packaged devices. A sealant, such as an epoxy resin, is sprayed using a nozzle onto the sidewall of a packaged device prior to singulation (while still in wafer form). The nozzle comprises multiple dispensing orifices along its sidewall. The nozzle may be comprised of one or more sets of multiple dispensing orifices on one or both opposing sides of the nozzle wall. The nozzle is comprised of dimensions which allow it to more easily access a packaged device or be inserted between packaged devices.

BRIEF DESCRIPTION OF THE DRAWINGS

Example embodiments are described with reference to accompanying drawings, wherein:

FIG. 1 (Prior Art) shows an on-state and an off-state micromirror.

FIGS. 5A-C (Prior Art) show aspects of packaged devices and substrate.

DETAILED DESCRIPTION OF EXAMPLE EMBODIMENTS

Figure 2A:
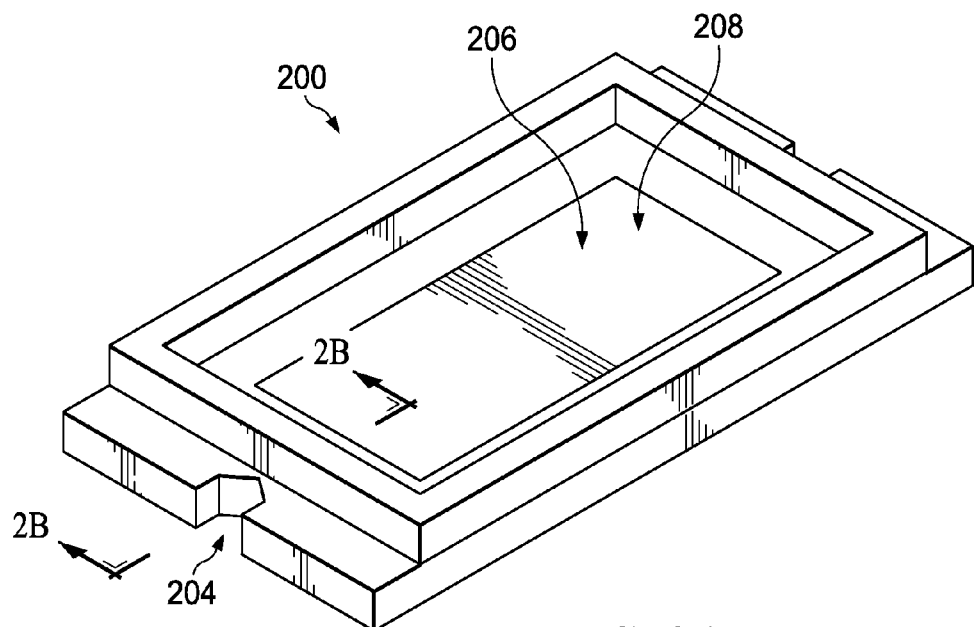
FIGS. 2A-B (Prior Art) shows drawings of a packaged micromirror device.
Figure 2B:
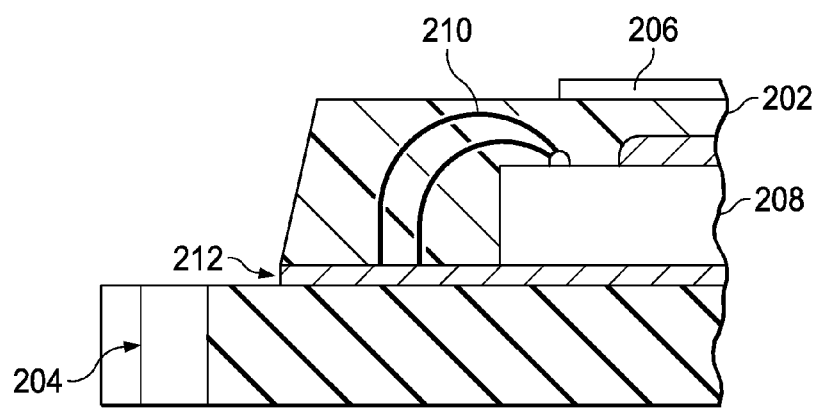
Figure 3:
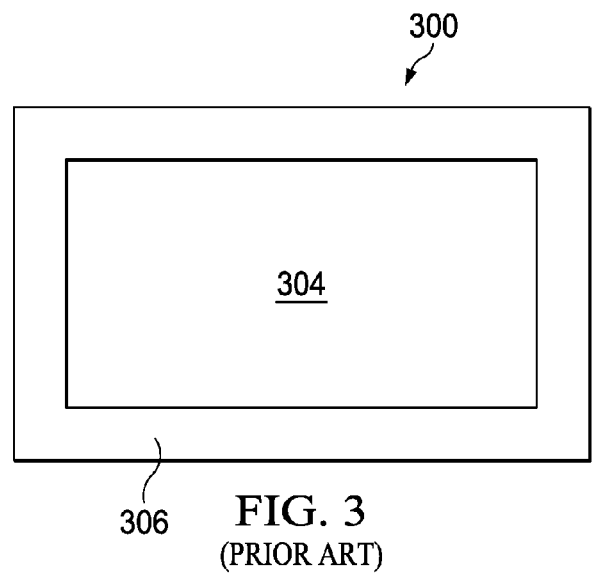
FIG. 3 (Prior Art) is an image of a display with an optical artifact.
Figure 4:
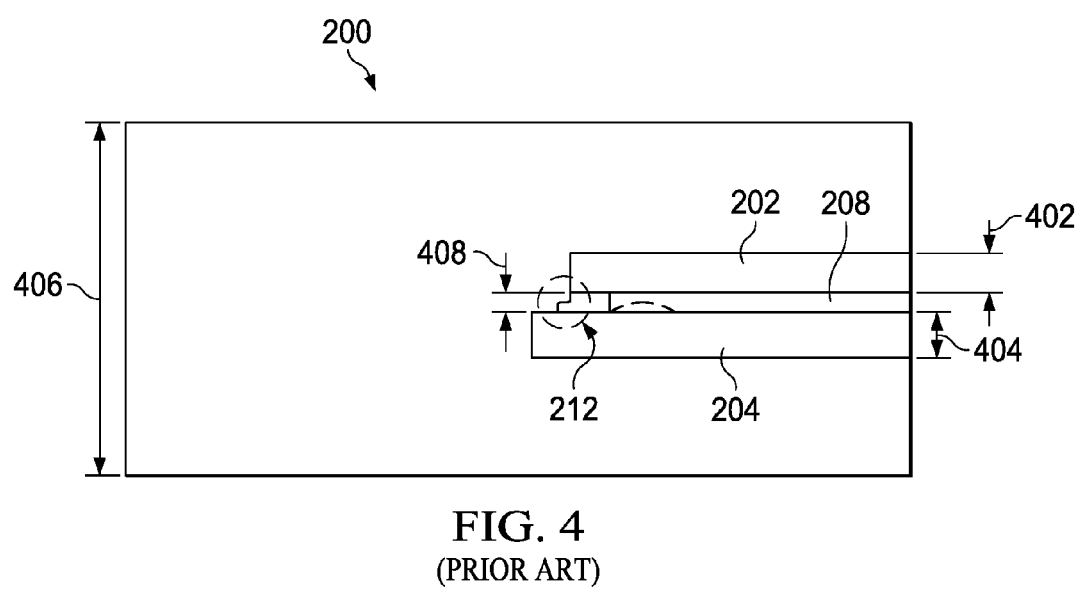
FIG. 4 (Prior Art) illustrates micromirror device dimensions.
Figure 6A:
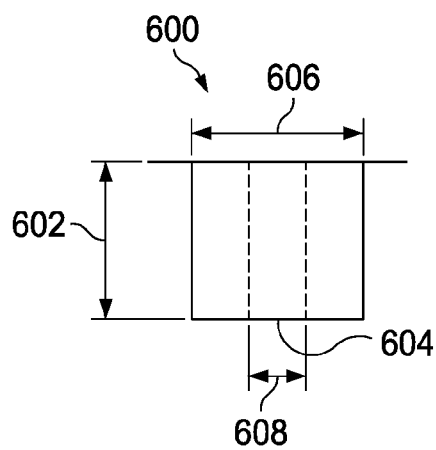
FIGS. 6A-D (Prior Art) show drawings of typical nozzles.
Figure 6B:
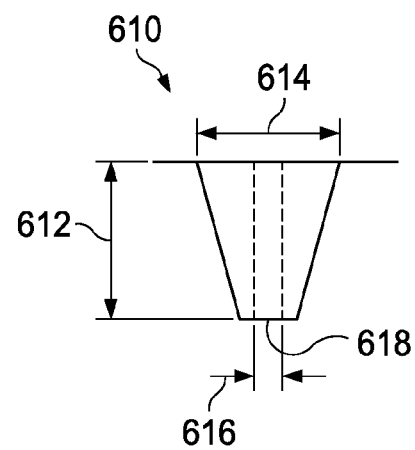
Figure 6C:
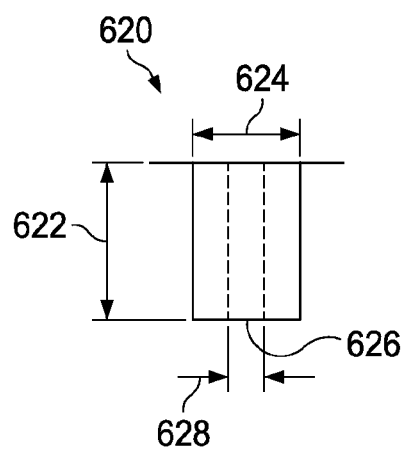
Figure 6D:
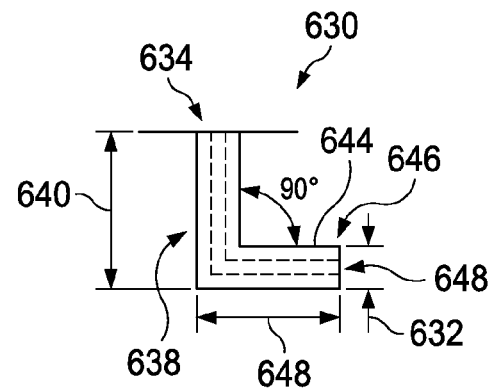
Figure 7A:
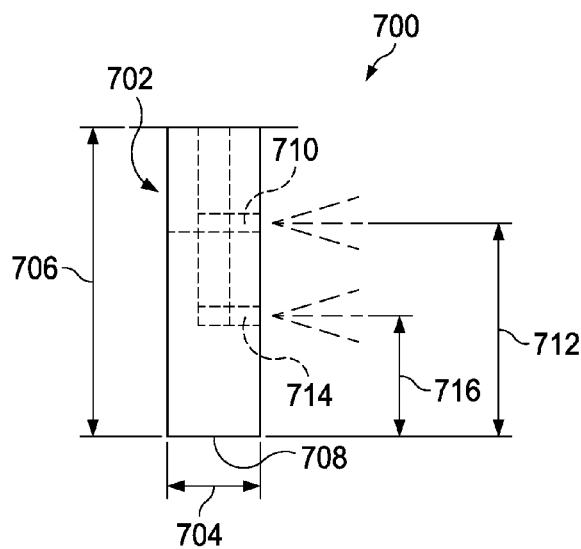
FIGS. 7A-B illustrate a single sided nozzle.
Figure 7B:
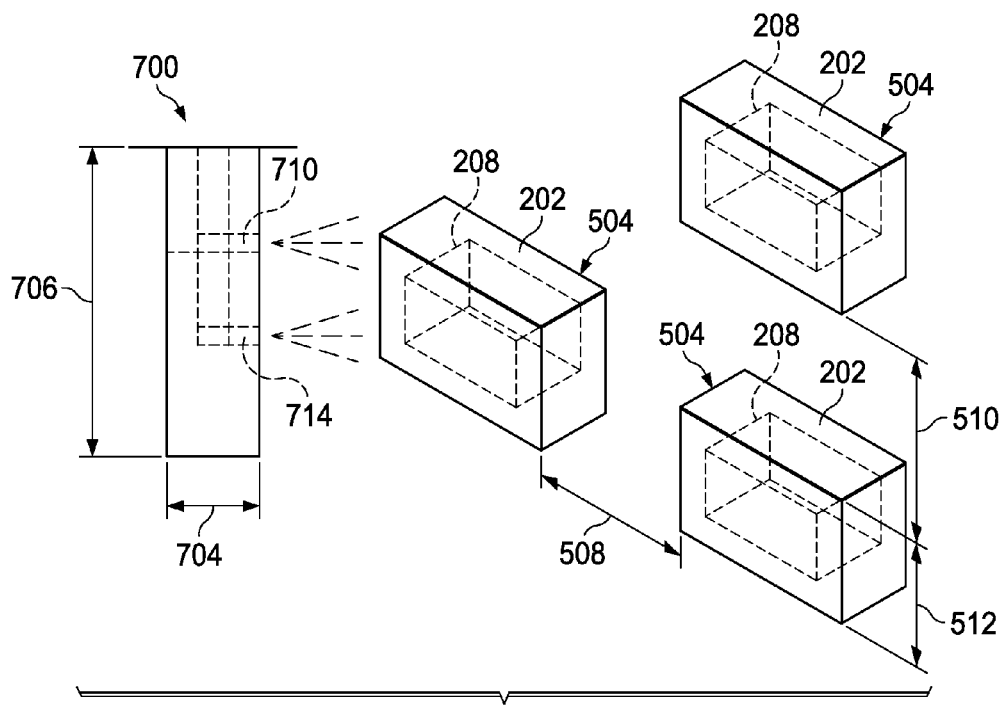
Figure 8A:
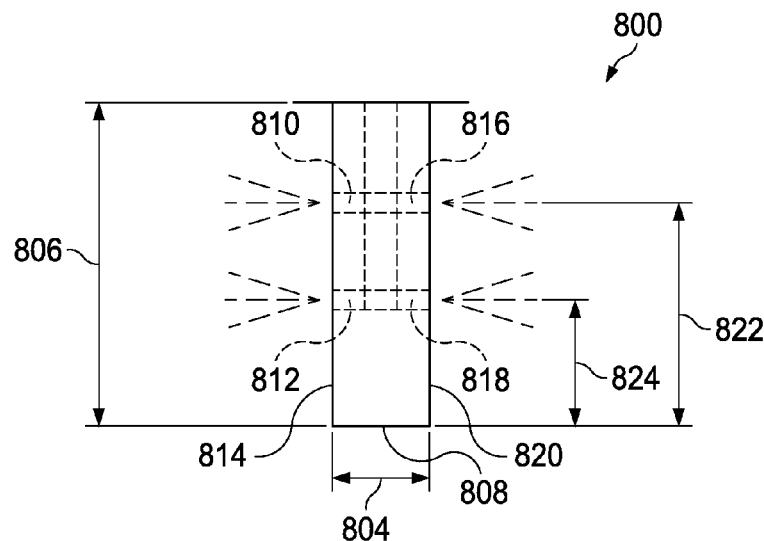
FIGS. 8A-B show a double-sided nozzle.
Figure 8B:
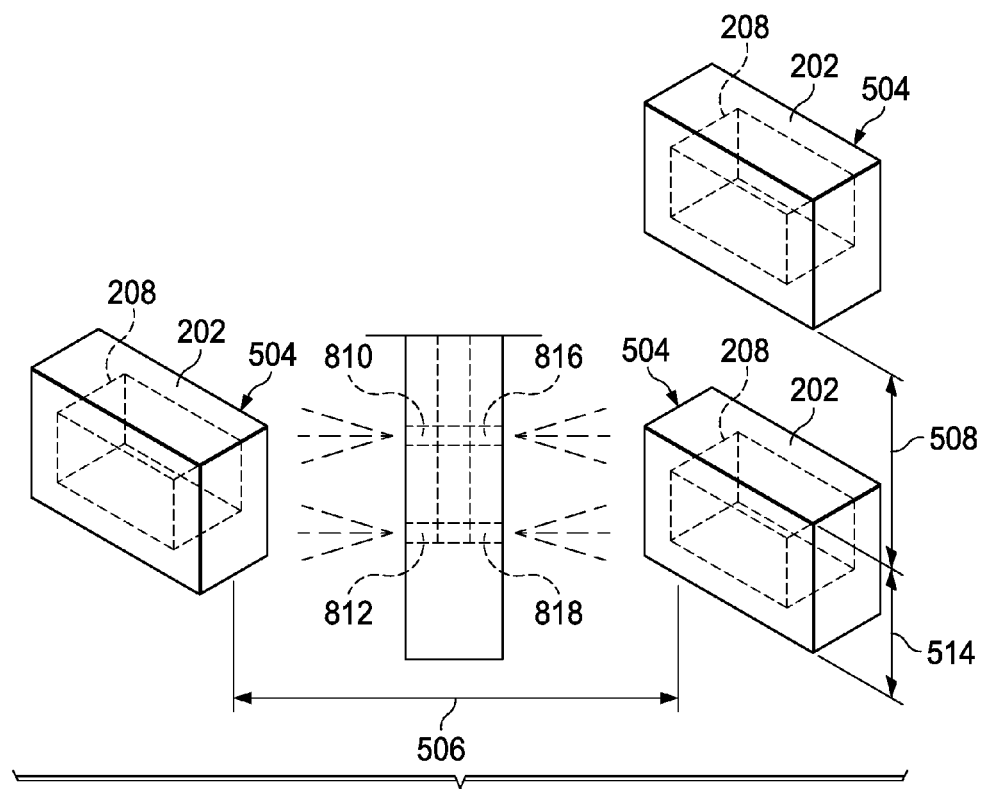
Figure 9A:
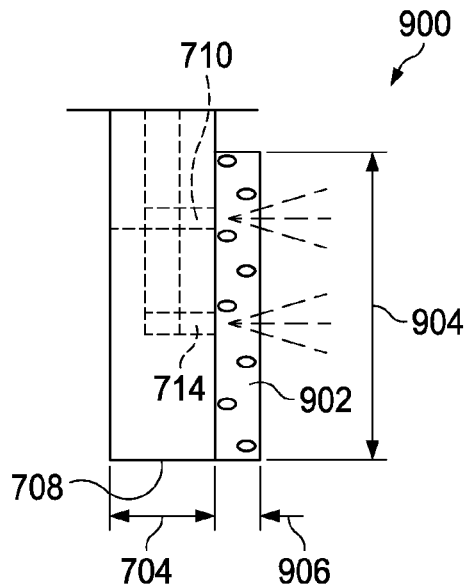
FIGS. 9A-B show modifications to the single-sided and double-sided multi-spray nozzles.
Figure 9B:
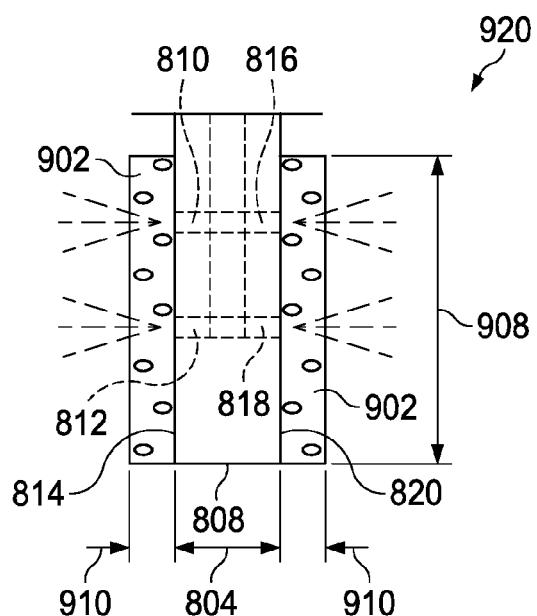
Figure 10:
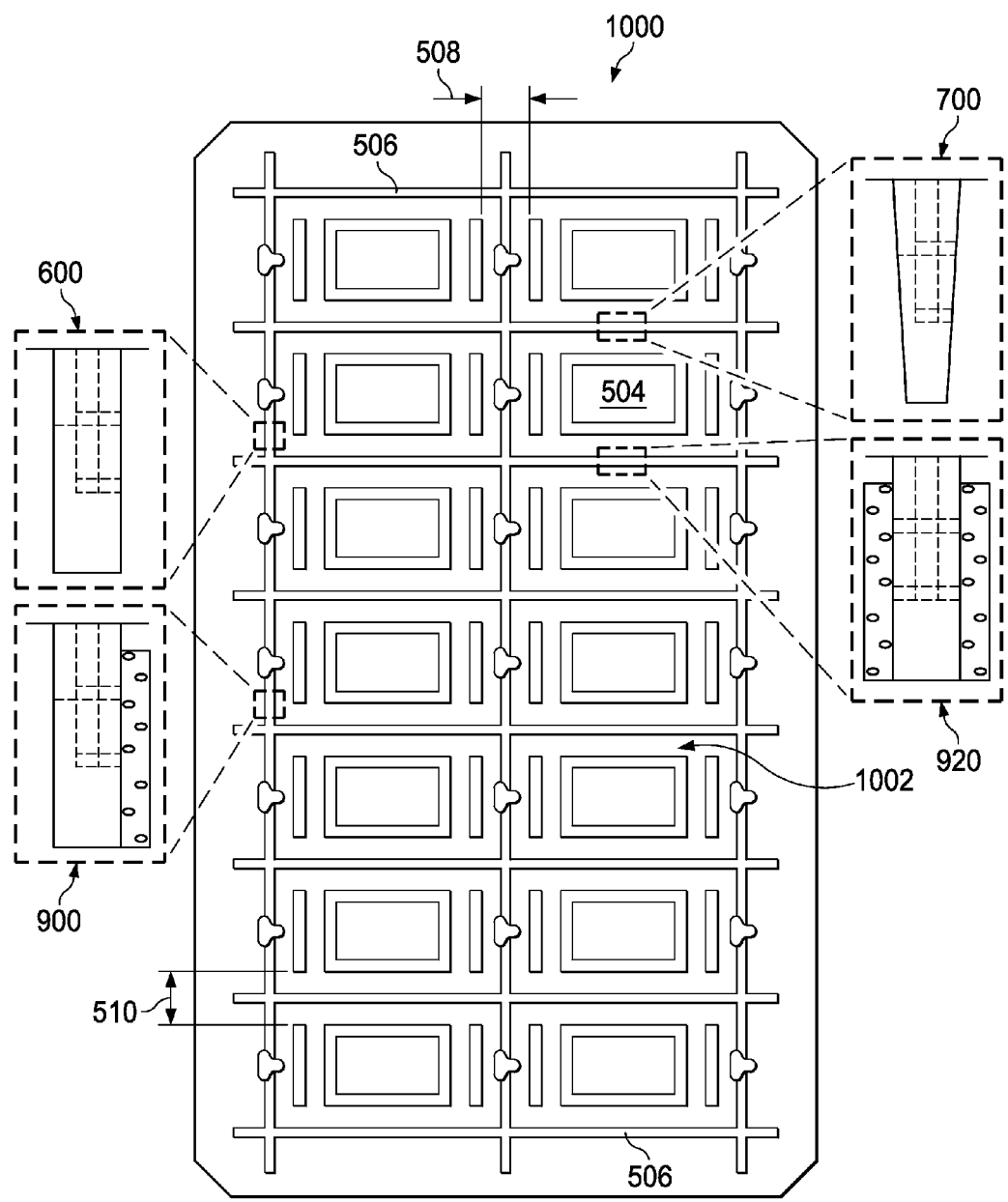
FIG. 10 illustrates a packaged device array with possible application of single and double-sided multi-spray nozzles.

Quality and reliability of MEMS can be improved by being able to insert nozzles and dispense packaging materials more fully between adjacent micromirror devices, repeatedly and consistently using a high speed and automated dispensing system, and to dispense controlled amounts of liquid in a horizontal direction parallel to the plane of the wafer substrate. Horizontal dispensing allows improved dispensing on packaging edges.

A typical approach for forming a hermetic seal around a MEMS package is to dispense epoxy or other liquid from above the packaged device using a nozzle controlled by an automated system programmed to follow a predefined path. The method of dispensing controlled drops of liquid requires precise placement such that excessive material is not deposited on nor does it migrate onto scribe lines. Epoxy or other material deposited across scribe lines may cause unwanted cracks and defects when the packaged devices are singulated or cause the scribe lines not to fracture as intended. Excessive deposited material can also cause mechanical stress across the substrate wafer which may damage the packaged device or cause the substrate wafer to bow under stress. Uniform thickness of deposited material improves the singulation process.

A new type of nozzle can improve the precision and accuracy of dispensing while also improving the coverage of dispensed material by spraying in a direction parallel to the plane of the substrate.

FIGS. 7A-B illustrate a nozzle for single sided dispensing.

FIG. 7A illustrates a nozzle 700. In an example embodiment, nozzle 700 has a three dimensional shape 702 with a diameter 704, such as for a cylinder, or a width 704, such as for a rectangular cube. The dimension 704 is smaller than dimensions 508 and 510. Nozzle 700 has a length 706 which is at least as long as the height 512 of the packaged device 504. A distal end 708 is enclosed. A group 710 of orifices is placed on one vertical sidewall of nozzle 700 at a distance 712 from the distal end 708. Another group 714 of sidewall orifices is placed at a shorter distance 716 from the distal end 708. The placement of groups of sidewall orifices 710 and 714 in the nozzle 700 can be adjusted as needed for device 504 dimensions.

The nozzle 700 is inserted adjacent to the packaged device 504. A sealant material such as epoxy is sprayed from sidewall orifices 710 and 714 onto the device 504. The volume of liquid dispensed is precisely controlled for consistent and repeatable device packaging. After dispensing, the nozzle 700 is moved vertically upwards from the packaged device 504 and to its next programmed location, is inserted adjacent to another device 504, and repeats the spraying action. The epoxy is cured after being sprayed.

FIG. 7B shows a possible configuration for single sided spraying of liquids onto a packaged device 504. For example, orifices 710 and 714 are inserted facing device 504 and liquid is dispensed onto the side 716 of device 504. The width or diameter 704 is smaller than dimensions 508 or 510 between adjacent packaged devices 504. The length 706 is at least as long as height 512.

FIGS. 8A-B illustrate a nozzle for double sided dispensing of liquids.

FIG. 8A shows a nozzle 800. In an example embodiment, nozzle 800 has a three-dimensional shape with a diameter 804, such as for a cylinder, or a width 804, such as for a rectangular cube, which is smaller than dimensions 508 and 510. Nozzle 800 has a length 806 which is at least as long as the height 512 of the packaged device 504. A distal end 808 is enclosed. Sidewall orifices 810 and sidewall orifices 812 are patterned into a side 814 of the shape 802. Sidewall orifices 816 and 818 are patterned into an opposing side 820.

Orifices 810 and 816 are a distance 822 from the distal end 808 and orifices 812 and 818 are a distance 824 from the distal end 808. The placement of sidewall orifices 810 and 816 may be adjusted to device dimensions.

FIG. 8B shows a possible configuration for double sided dispensing onto adjacent devices 504. Nozzle 800 is inserted within two adjacent devices 504 to simultaneously spray both packaged devices 504. Sidewall orifices located on two opposing sidewalls of the nozzle 800 improve the efficiency and speed of the dispensing process.

It is possible that the nozzles 700 and 800 comprise more than two orifices on each side or that the distal ends 708 and 808 comprise an additional orifice for spraying in a vertical direction perpendicular to the plane of the substrate.

FIGS. 9A-B show modified versions of nozzles 700 and 800.

FIG. 9A shows a nozzle 900 with a foam 902 or other permeable material attached over the orifices 710 and 714. The foam 902 is of length 904 which is at least as long as length 822 covers the nozzle 900 from orifice 710 to distal end 708. The foam 902 is of width 906. Nozzle 900 is inserted adjacent to and facing devices 504, epoxy is sprayed from orifices 710 and 714 onto the foam 902, the foam 902 is placed in contact against the sidewall of packaged device 504, and nozzle 900 is moved vertically or horizontally. Nozzle 900 is used with a brushing motion to place epoxy onto the side of packaged device 504. The width 704 of the nozzle 900 and width 906 of the foam 902 is less than widths 506 and 508 of the device 504. The permeable material 902 allows a wiping action for the nozzle and minimizes the fluid within the "keep-out zones" around the device. The "keep-out zones" are fluid-free areas surrounding the device. Epoxy on or near scribe lines can cause difficulties with the singulation process. The foam 902 is typically consumed with time and replaced as necessary.

FIG. 9B illustrates the nozzle 920 with foam 902 placed against both groups of orifices 810 and 814 on one sidewall of the nozzle 920 and orifices 816 and 820 on the opposite sidewall of nozzle 920. The foam 902 on two sides has a length 908 which is at least as long as length 822 and a width 910.

Nozzle 920 is inserted between adjacent packaged devices 504, epoxy is sprayed from orifices 810 and 814 and orifices 816 and 820 onto foam 902. The sum of width 804 of nozzle 920 and twice the width 910 of the foam 902 is less than widths 506 and 508 of the packaged device 504. Foam 902 is placed in contact with each side of two adjacent devices 504. Nozzle 920 is moved vertically or horizontally. Nozzle 920 is used in a brushing motion to place epoxy onto the two adjacent devices 504. The foam 902 is typically consumed with time and replaced as necessary.

FIG. 10 shows an example of a device array 1000 with multiple packaged devices 504. Scribe lines 506 separate each device 504 with the space 508 between adjacent packaged devices 504 in the horizontal direction and the space 510 between adjacent devices 504 in the vertical direction. A space 1002, a "keep-out zone", provides space for fluid overflow to prevent fluids from leaking onto the scribe lines 506.

Nozzle 600 or nozzle 800 may be more suitable for use at the perimeter of the device array 1000. Within the device array 1000, nozzle 800 or nozzle 920 are better configured to process two adjacent packaged devices 504 simultaneously.

Those skilled in the art to which the invention relates will appreciate that modifications may be made to the described example embodiments, and also that many other embodiments are possible, within the scope of the claimed invention.

What is claimed is:

1. A method of hermetically sealing devices, comprising:
fabricating a plurality of devices on a device substrate;
placing a packaging substrate below the device;
attaching bonding wires from each device to bond pads;
placing a cover above each device to form a plurality of packaged devices;
spraying a sealant using a nozzle comprising multiple orifices on a sidewall of the nozzle and an enclosed distal end, onto each packaged device;
curing the sprayed sealant; and
fracturing the device and packaging substrates to singulate the plurality of packaged devices;
wherein the spraying step comprises dispensing the sealant into a permeable material on the sidewall of the nozzle and performing a wiping action with the permeable material.

2. The method of claim 1, wherein the multiple orifices of the nozzle are arranged in one or more groups and vertically aligned along the sidewall of the nozzle.

3. The method of claim 1, wherein the nozzle sprays in a direction parallel to a plane of the device substrate.

4. The method of claim 3, wherein the nozzle sprays onto the sidewall and the cover.

5. The method of claim 4, wherein the nozzle sprays from the multiple orifices simultaneously.

6. The method of claim 1, wherein the multiple orifices of the nozzle are arranged in two or more groups of dispensing orifices on two opposing sidewalls.

7. A method of hermetically sealing MEMS devices, comprising:
fabricating a plurality of MEMS devices on a device substrate, each MEMS device comprising an array of micromirrors;
attaching bonding wires from each MEMS device to bond pads;
placing a packaging substrate below the MEMS device;
placing a cover above each MEMS device to form a plurality of packaged MEMS devices;
placing a transparent window within the cover;
spraying a sealant using a nozzle comprising multiple orifices on a sidewall of the nozzle and an enclosed distal end, onto each packaged MEMS device;
curing the sprayed sealant; and
fracturing the device and packaging substrates to singulate the plurality of packaged MEMS devices;
wherein the spraying step comprises dispensing the sealant into a permeable material on the sidewall of the nozzle and performing a wiping action with the permeable material.

8. The method of claim 7, wherein the multiple orifices of the nozzle are arranged in one or more groups and vertically aligned along the sidewall of the nozzle.

9. The method of claim 7, wherein the nozzle sprays in a direction parallel to a plane of the device substrate.

10. The method of claim 9, wherein the nozzle sprays onto the sidewall and the cover.

11. The method of claim 10, wherein the nozzle sprays from the multiple orifices simultaneously.

12. The method of claim 7, wherein the multiple orifices of the nozzle are arranged in two or more groups of dispensing orifices on two opposing sidewalls.

13. A nozzle for spraying a sealant onto packaged devices of a wafer for hermetic sealing, comprising:
a length greater than a height of the packaged devices;
a width less than a space between adjacent packaged devices;
a permeable material on a sidewall of the nozzle to perform a wiping action;
a group of orifices on the sidewall of the nozzle to dispense the sealant into the permeable material on the sidewall, the permeable material covering the group of orifices; and
an enclosed distal end.

14. The nozzle of claim 13, wherein the sidewall is a first sidewall, and the group of orifices is a first group of orifices, and further comprising: a second group of orifices on the first sidewall of the nozzle.

15. The nozzle of claim 14, further comprising a third group of orifices on a second sidewall of the nozzle, the second sidewall being opposite the first sidewall.

16. The nozzle of claim 15, further comprising a fourth group of orifices on the second sidewall of the nozzle.

17. The nozzle of claim 13, wherein the sidewall is a first sidewall, and the group of orifices is a first group of orifices, and further comprising:
a second group of orifices on a second sidewall of the nozzle, the second sidewall being opposite the first sidewall;
wherein the permeable material is on the first sidewall and the second sidewall, the permeable material covering the first group of orifices and the second group of offices.

* * * * *